US009735044B2

(12) United States Patent
Costa

(10) Patent No.: US 9,735,044 B2
(45) Date of Patent: Aug. 15, 2017

(54) METHOD OF MANUFACTURE FOR A SILICON-ON-PLASTIC SEMICONDUCTOR DEVICE WITH INTERFACIAL ADHESION LAYER

(71) Applicant: RF Micro Devices, Inc., Greensboro, NC (US)

(72) Inventor: Julio C. Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/715,830

(22) Filed: May 19, 2015

(65) Prior Publication Data
US 2015/0255368 A1 Sep. 10, 2015

Related U.S. Application Data

(63) Continuation-in-part of application No. 14/260,909, filed on Apr. 24, 2014, now abandoned, and a
(Continued)

(51) Int. Cl.
*H01L 21/00* (2006.01)
*H01L 21/762* (2006.01)
(Continued)

(52) U.S. Cl.
CPC ...... *H01L 21/76251* (2013.01); *H01L 23/293* (2013.01); *H01L 23/36* (2013.01);
(Continued)

(58) Field of Classification Search
CPC ............. H01L 21/76251; H01L 21/568; H01L 21/6835; H01L 23/293; H01L 23/36;
(Continued)

(56) References Cited

U.S. PATENT DOCUMENTS

| 4,093,562 A | 6/1978 | Kishimoto |
| 4,366,202 A | 12/1982 | Borovsky |

(Continued)

FOREIGN PATENT DOCUMENTS

| CN | 103811474 A | 5/2014 |
| JP | 2006005025 A | 1/2006 |

(Continued)

OTHER PUBLICATIONS

Notice of Allowance for U.S. Appl. No. 14/261,029, mailed Apr. 27, 2015, 10 pages.

(Continued)

*Primary Examiner* — Nikolay Yushin
(74) *Attorney, Agent, or Firm* — Withrow & Terranova, P.L.L.C.

(57) ABSTRACT

A semiconductor device and methods for manufacturing the same are disclosed. The semiconductor device includes a polymer substrate and an interfacial layer over the polymer substrate. A buried oxide layer resides over the interfacial layer, and a device layer with at least a portion of a field effect device resides over the buried oxide layer. The polymer substrate is molded over the interfacial adhesion layer and has a thermal conductivity greater than 2 watts per meter Kelvin (W/mK) and an electrical resistivity greater than $10^{12}$ Ohm-cm. Methods of manufacture for the semiconductor device include removing a wafer handle to expose a first surface of the buried oxide layer, disposing the interfacial adhesion layer onto the first surface of the buried oxide layer, and molding the polymer substrate onto the interfacial adhesion layer.

20 Claims, 15 Drawing Sheets

Related U.S. Application Data continuation-in-part of application No. 13/852,648, filed on Mar. 28, 2013, now abandoned, application No. 14/715,830, which is a continuation-in-part of application No. 14/261,029, filed on Apr. 24, 2014, now Pat. No. 9,214,337, and a continuation-in-part of application No. 13/852,648, filed on Mar. 28, 2013, application No. 14/715,830, which is a continuation-in-part of application No. 14/529,870, filed on Oct. 31, 2014, now Pat. No. 9,583,414.

(60) Provisional application No. 62/000,264, filed on May 19, 2014, provisional application No. 61/815,327, filed on Apr. 24, 2013, provisional application No. 61/816,207, filed on Apr. 26, 2013, provisional application No. 61/773,490, filed on Mar. 6, 2013, provisional application No. 61/898,009, filed on Oct. 31, 2013.

(51) Int. Cl.
| | | |
|---|---|---|
| *H01L 27/12* | (2006.01) | |
| *H01L 23/29* | (2006.01) | |
| *H01L 23/36* | (2006.01) | |
| *H01L 23/373* | (2006.01) | |
| *H01L 29/786* | (2006.01) | |
| *H01L 23/31* | (2006.01) | |
| *H01L 21/56* | (2006.01) | |

(52) U.S. Cl.
CPC ...... *H01L 23/3737* (2013.01); *H01L 27/1203* (2013.01); *H01L 27/1266* (2013.01); *H01L 29/78603* (2013.01); *H01L 29/78606* (2013.01); *H01L 21/568* (2013.01); *H01L 23/3107* (2013.01); *H01L 23/3192* (2013.01); *H01L 2224/13* (2013.01); *H01L 2224/13022* (2013.01)

(58) Field of Classification Search
CPC ............. H01L 23/3737; H01L 23/3107; H01L 27/1203; H01L 27/12; H01L 27/1218; H01L 29/78606; H01L 29/78603; H01L 29/786; H01L 2224/13
See application file for complete search history.

(56) References Cited

U.S. PATENT DOCUMENTS

| | | | |
|---|---|---|---|
| 5,061,663 A | 10/1991 | Bolt et al. | |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A * | 7/1997 | Iwaki ................ | G02F 1/13454 257/347 |
| 5,699,027 A | 12/1997 | Tsuji et al. | |
| 5,709,960 A | 1/1998 | Mays et al. | |
| 5,831,369 A | 11/1998 | Fürbacher et al. | |
| 5,920,142 A | 7/1999 | Onishi et al. | |
| 6,072,557 A * | 6/2000 | Kishimoto ......... | G02F 1/13394 349/106 |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,864,156 B1 | 3/2005 | Conn | |
| 6,943,429 B1 | 9/2005 | Glenn et al. | |
| 6,992,400 B2 | 1/2006 | Tikka et al. | |
| 7,042,072 B1 | 5/2006 | Kim et al. | |
| 7,109,635 B1 | 9/2006 | McClure et al. | |
| 7,183,172 B2 | 2/2007 | Lee et al. | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,855,101 B2 | 12/2010 | Furman et al. | |
| 7,868,419 B1 | 1/2011 | Kerr et al. | |
| 7,960,218 B2 | 6/2011 | Ma et al. | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,772,853 B2 | 7/2014 | Hong et al. | |
| 8,802,495 B2 | 8/2014 | Kim et al. | |
| 8,816,407 B2 | 8/2014 | Kim et al. | |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 * | 1/2015 | Cohen ............... | H01L 29/66484 257/29 |
| 2001/0004131 A1 | 6/2001 | Masayuki et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0108585 A1 | 5/2006 | Gan et al. | |
| 2006/0261446 A1 | 11/2006 | Wood et al. | |
| 2007/0020807 A1 | 1/2007 | Geefay et al. | |
| 2007/0069393 A1 | 3/2007 | Asahi et al. | |
| 2007/0121326 A1 | 5/2007 | Nall et al. | |
| 2007/0190747 A1 | 8/2007 | Humpston et al. | |
| 2007/0252481 A1 | 11/2007 | Iwamoto et al. | |
| 2007/0276092 A1 | 11/2007 | Kanae et al. | |
| 2008/0050852 A1 | 2/2008 | Hwang et al. | |
| 2008/0272497 A1 | 11/2008 | Lake | |
| 2008/0315372 A1 | 12/2008 | Kuan et al. | |
| 2009/0014856 A1 | 1/2009 | Knickerbocker | |
| 2010/0012354 A1 | 1/2010 | Hedin et al. | |
| 2010/0045145 A1 | 2/2010 | Tsuda | |
| 2010/0081232 A1 | 4/2010 | Furman et al. | |
| 2010/0081237 A1 | 4/2010 | Wong et al. | |
| 2010/0173436 A1 | 7/2010 | Ouellet et al. | |
| 2011/0026232 A1 | 2/2011 | Lin et al. | |
| 2011/0036400 A1 | 2/2011 | Murphy et al. | |
| 2011/0068433 A1 | 3/2011 | Kim et al. | |
| 2011/0102002 A1 | 5/2011 | Riehl et al. | |
| 2012/0003813 A1 | 1/2012 | Chuang et al. | |
| 2012/0068276 A1 | 3/2012 | Lin et al. | |
| 2012/0094418 A1 | 4/2012 | Grama et al. | |
| 2012/0119346 A1 | 5/2012 | Im et al. | |
| 2013/0015429 A1 | 1/2013 | Hong et al. | |
| 2013/0134956 A1 | 5/2013 | Khlat | |
| 2013/0155681 A1 | 6/2013 | Nall et al. | |
| 2013/0196483 A1 | 8/2013 | Dennard et al. | |
| 2013/0299871 A1 | 11/2013 | Mauder et al. | |
| 2014/0168014 A1 | 6/2014 | Chih et al. | |
| 2014/0210314 A1 | 7/2014 | Bhattacharjee et al. | |
| 2014/0252566 A1 | 9/2014 | Kerr et al. | |
| 2014/0252567 A1 | 9/2014 | Carroll et al. | |
| 2014/0264813 A1 | 9/2014 | Lin et al. | |
| 2014/0264818 A1 | 9/2014 | Lowe, Jr. et al. | |
| 2014/0306324 A1 | 10/2014 | Costa et al. | |
| 2014/0327150 A1 | 11/2014 | Jung et al. | |
| 2015/0115416 A1 | 4/2015 | Costa et al. | |
| 2015/0130045 A1 | 5/2015 | Tseng et al. | |
| 2015/0235990 A1 | 8/2015 | Cheng et al. | |
| 2015/0235993 A1 | 8/2015 | Cheng et al. | |
| 2015/0364344 A1 | 12/2015 | Yu et al. | |

(56) References Cited

U.S. PATENT DOCUMENTS

FOREIGN PATENT DOCUMENTS

| JP | 2007227439 A | 9/2007 |
|---|---|---|
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Anderson, D.R., "Thermal Conductivity of Polymers," Sandia Corporation, Mar. 8, 1966, pp. 677-690.

Author Unknown, "CoolPoly D5108 Thermally Conductive Polyphenylene Sulfide (PPS)," Cool Polymers, Inc., Aug. 8, 2007, 2 pages.

Author Unknown, "CoolPoly D-Series—Thermally Conductive Dielectric Plastics," Cool Polymers, Retrieved Jun. 24, 2013, http://coolpolymers.com/dseries.asp, 1 page.

Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.

Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.

Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.

Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.

Author Unknown, "CoolPoly Selection Tool," Cool Polymers, Inc., 2006, 1 page, http://www.coolpolymers.com/select.asp?Application=Substrates+%26+Electcronic_Packaging.

Author Unknown, "CoolPoly Thermally Conductive Plastics for Dielectric Heat Plates," Cool Polymers, Inc., 2006, 2 pages, http://www.coolpolymers.com/heatplate.asp.

Author Unknown, "CoolPoly Thermally Conductive Plastics for Substrates and Electronic Packaging," Cool Polymers, Inc., 2005, 1 page.

Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.

Author Unknown, "Heat Transfer," Cool Polymers, Inc., 2006, http://www.coolpolymers.com/heattrans.html, 2 pages.

Author Unknown, "Plastics that Conduct Heat," Plastics Technology Online, Jun. 2001, Retrieved Jun. 24, 2013, http://www.ptonline.com/articles/plastics-that-conduct-heat, 4 pages.

Author Unknown, "Sapphire Substrate," from CRC Handbook of Chemistry and Physics, Date Unknown, 1 page.

Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.

Author Unknown, "Thermal Properties of Solids," PowerPoint Presentation, No Date, 28 slides, http://www.phys.huji.ac.il/Phys_Hug/Lectures/77602/PHONONS_2_thermal.pdf.

Author Unknown, "Thermal Resistance & Thermal Conductance," C-Therm Technologies Ltd., accessed Sep. 19, 2013, 3 pages, http://www.ctherm.com/products/tci_thermal_conductivity/helpful_links_tools/thermal_resistance_thermal_conductance/.

Author Unknown, "CoolPoly D5506 Thermally Conductive Liquid Crystalline Polymer (LCP)," Cool Polymers, Inc., Dec. 12, 2013, 2 pages.

Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.

Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.

Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.

Colinge, J.P., et al., "A Low-Voltage, Low-Power Microwave SOI MOSFET," Proceedings of 1996 IEEE International SOI Conference, Oct. 1996, pp. 128-129.

Costa, J., "RFCMOS SOI Technology for 4G Reconfigurable RF Solutions," Session WEC1-2, Proceedings of the 2013 IEEE International Microwave Symposium, 4 pages.

Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.

Jung, Boo Yang, et al., "Study of FCMBGA with Low CTE Core Substrate," 2009 Electronic Components and Technology Conference, May 2009, pp. 301-304.

Kerr, D.C., et al., "Identification of Rf Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.

Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.

Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.

Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.

Mamunya, Ye.P., et al., "Electrical and Thermal Conductivity of Polymers Filled with Metal Powders," European Polymer Journal, vol. 38, 2002, pp. 1887-1897.

Niklaus, F., et al., "Adhesive Wafer Bonding," Journal of Applied Physics, vol. 99, No. 3, 031101 (2006), 28 pages.

Parthasarathy, S., et al., "RF SOI Switch FET Design and Modeling Tradeoffs for GSM Applications," 2010 23rd International Conference on VLSI Design, (VLSID '10), Jan. 2010, pp. 194-199.

Raskin, J.P., et al., "Coupling Effects in High-Resistivity SIMOX Substrates for VHF and Microwave Applications," Proceedings of 1995 IEEE International SOI Conference, Oct. 1995, pp. 62-63.

Rong, B., et al., "Surface-Passivated High-Resistivity Silicon Substrates for RFICs," IEEE Electron Device Letters, vol. 25, No. 4, Apr. 2004, pp. 176-178.

Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.

Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.

Non-Final Office Action for U.S. Appl. No. 13/852,648, mailed Jul. 18, 2013, 20 pages.

Final Office Action for U.S. Appl. No. 13/852,648, mailed Nov. 26, 2013, 21 pages.

Applicant-Initiated Interview Summary for U.S. Appl. No. 13/852,648, mailed Jan. 27, 2014, 3 pages.

Advisory Action for U.S. Appl. No. 13/852,648, mailed Mar. 7, 2014, 4 pages.

Notice of Allowance for U.S. Appl. No. 13/852,648, mailed Jun. 16, 2014, 9 pages.

Notice of Allowance for U.S. Appl. No. 13/852,648, mailed Sep. 26, 2014, 8 pages.

(56) References Cited

OTHER PUBLICATIONS

Notice of Allowance for U.S. Appl. No. 13/852,648, mailed Jan. 22, 2015, 8 pages.
Non-Final Office Action for U.S. Appl. No. 13/852,648, mailed Jun. 24, 2015, 20 pages.
Non-Final Office Action for U.S. Appl. No. 14/315,765, mailed Jan. 2, 2015, 6 pages.
Final Office Action for U.S. Appl. No. 14/315,765, mailed May 11, 2015, 17 pages.
Advisory Action for U.S. Appl. No. 14/315,765, mailed Jul. 22, 2015, 3 pages.
Non-Final Office Action for U.S. Appl. No. 14/260,909, mailed Mar. 20, 2015, 20 pages.
Final Office Action for U.S. Appl. No. 14/260,909, mailed Aug. 12, 2015, 18 pages.
Non-Final Office Action for U.S. Appl. No. 14/261,029, mailed Dec. 5, 2014, 15 pages.
Final Office Action for U.S. Appl. No. 13/852,648, mailed Oct. 22, 2015, 20 pages.
Corrected Notice of Allowability for U.S. Appl. No. 14/261,029, mailed Nov. 17, 2015, 5 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209.
Mansour, Raafat R., "RF MEMS-CMOS Device Integration," IEEE Microwave Magazine, vol. 14, No. 1, Jan. 2013, pp. 39-56.
Mazure, C. et al., "Advanced SOI Substrate Manufacturing," 2004 IEEE International Conference on Integrated Circuit Design and Technology, 2004, IEEE, pp. 105-111.
Raskin, Jean-Pierre et al., "Substrate Crosstalk Reduction Using SOI Technology," IEEE Transactions on Electron Devices, vol. 44, No. 12, Dec. 1997, pp. 2252-2261.
Non-Final Office Action for U.S. Appl. No. 13/852,648, mailed Feb. 19, 2016, 12 pages.
Non-Final Office Action for U.S. Appl. No. 14/529,870, mailed Feb. 12, 2016, 14 pages.
Finne, R. M. et al., "A Water-Amine-Complexing Agent System for Etching Silicon," Journal of The Electrochemical Society, vol. 114, No. 9, Sep. 1967, pp. 965-970.
Extended European Search Report for European Patent Application No. 15184861.1, mailed Jan. 25, 2016, 6 pages.
Non-Final Office Action for U.S. Appl. No. 12/906,689, mailed May 27, 2011, 13 pages.
Non-Final Office Action for U.S. Appl. No. 12/906,689, mailed Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Final Office Action for U.S. Appl. No. 13/852,648, mailed Jul. 20, 2016, 14 pages.
Notice of Allowance for U.S. Appl. No. 14/529,870, mailed Jul. 15, 2016, 8 pages.
International Search Report and Written Opinion for PCT/US2016/045809, mailed Oct. 7, 2016, 11 pages.
Non-Final Office Action for U.S. Appl. No. 14/851,652, mailed Oct. 7, 2016, 10 pages.
Notice of Allowance for U.S. Appl. No. 14/959,129, mailed Oct. 11, 2016, 8 pages.
Non-Final Office Action for U.S. Appl. No. 15/173,037, mailed Jan. 10, 2017, 8 pages.
Advisory Action for U.S. Appl. No. 14/885,202, mailed Nov. 29, 2016, 3 pages.
Notice of Allowance for U.S. Appl. No. 14/885,202, mailed Jan. 27, 2017, 7 pages.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Non-Final Office Action for U.S. Appl. No. 14/885,202, mailed Apr. 14, 2016, 5 pages.
Final Office Action for U.S. Appl. No. 14/885,202, mailed Sep. 27, 2016, 7 pages.
Notice of Allowance for U.S. Appl. No. 14/885,243, mailed Aug. 31, 2016, 8 pages.
Office Action of the Intellectual Property Office for Taiwanese Patent Application No. 104130224, dated Jun. 15, 2016, 9 pages.
Non-Final Office Action for U.S. Appl. No. 15/085,185, dated Feb. 15, 2017, 10 pages.
Non-Final Office Action for U.S. Appl. No. 15/293,947, dated Apr. 7, 2017, 12 pages.
Notice of Allowance for U.S. Appl. No. 14/851,652, dated Apr. 11, 2017, 9 pages.
Final Office Action for U.S. Appl. No. 15/173,037, dated May 2, 2017, 13 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/353,346, dated May 23, 2017, 15 pages.

* cited by examiner

Cool Polymers®
CoolPoly® D5506 THERMALLY CONDUCTIVE LIQUID CRYSTALLINE POLYMER (LCP)
CoolPoly D series of thermally conductive plastics transfers heat, a characteristic previously unavailable in injection molding grade polymers. CoolPoly is lightweight, netshape moldable and allows design freedom in applications previously restricted to metals. The D series is electrically non-conductive and can be used for its dielectric properties.

| THERMAL | SI/METRIC |
|---|---|
| THERMAL CONDUCTIVITY | 10 W/mK |
| THERMAL DIFFUSIVITY | 0.05 $cm^2$/sec |
| SPECIFIC HEAT | 1.0 J/g°C |
| COEFFICIENT OF LINEAR THERMAL EXPANSION | |
|    PARALLEL | 6.2 ppm/°C |
|    NORMAL | 5.6 ppm/°C |
| TEMPERATURE OF DEFLECTION | |
|    @ 0.45 MPa | >300 °C |
|    @ 1.80 MPa | 263 °C |
| FLAMMABILITY | V0 @ 1.0 mm |
| MECHANICAL | SI/METRIC |
| TENSILE MODULUS | 10900 MPa |
| TENSILE STRENGTH | 50 MPa |
| NOMINAL STRAIN @ BREAK | 0.7 % |
| FLEXURAL STRENGTH | 84 MPa |
| FLEXURAL MODULUS | 12300 MPa |
| IMPACT STRENGTH | |
|    CHARPY UNNOTCHED | 6.0 $kJ/m^2$ |
|    CHARPY NOTCHED | 3.2 $kJ/m^2$ |
| ELECTRICAL | SI/METRIC |
| SURFACE RESISTIVITY | 2.0E14 OHM/SQUARE |
| VOLUME RESISTIVITY | 1.6E14 OHM-CM |
| PHYSICAL | SI/METRIC |
| DENSITY | 1.80 g/cc |
| MOLD SHRINKAGE | |
|    FLOW | 0.1 % |
|    CROSS-FLOW | 0.3 % |

*FIG. 8*

METHOD OF MANUFACTURE FOR A SILICON-ON-PLASTIC SEMICONDUCTOR DEVICE WITH INTERFACIAL ADHESION LAYER

RELATED APPLICATIONS

The present application claims priority to U.S. provisional patent application No. 62/000,264, filed May 19, 2014.

The present application claims priority to and is a continuation-in-part of U.S. patent application Ser. No. 14/260,909, filed Apr. 24, 2014, entitled "SILICON-ON-DUAL PLASTIC (SODP) TECHNOLOGY AND METHODS OF MANUFACTURING THE SAME," which claims priority to U.S. provisional patent applications No. 61/815,327, filed Apr. 24, 2013, and No. 61/816,207, filed Apr. 26, 2013. U.S. patent application Ser. No. 14/260,909, is a continuation-in-part of U.S. patent application Ser. No. 13/852,648, filed Mar. 28, 2013, entitled "SEMICONDUCTOR DEVICE WITH A POLYMER SUBSTRATE AND METHODS OF MANUFACTURING THE SAME," which claims priority to U.S. provisional patent application No. 61/773,490, filed Mar. 6, 2013.

The present application claims priority to and is a continuation-in-part of U.S. patent application Ser. No. 14/261,029, filed Apr. 24, 2014, entitled "PATTERNED SILICON-ON-PLASTIC (SOP) TECHNOLOGY AND METHODS OF MANUFACTURING THE SAME," which claims priority to U.S. provisional patent application No. 61/815,327, filed Apr. 24, 2013, and No. 61/816,207, filed Apr. 26, 2013. U.S. patent application Ser. No. 14/261,029, is a continuation-in-part of U.S. patent application Ser. No. 13/852,648, filed Mar. 28, 2013, entitled "SEMICONDUCTOR DEVICE WITH A POLYMER SUBSTRATE AND METHODS OF MANUFACTURING THE SAME," which claims priority to U.S. provisional patent application No. 61/773, 490, filed Mar. 6, 2013.

The present application claims priority to and is a continuation-in-part of U.S. patent application Ser. No. 14/529, 870, filed Oct. 31, 2014, entitled "SILICON-ON-PLASTIC SEMICONDUCTOR DEVICE AND METHOD OF MAKING THE SAME," which claims priority to U.S. provisional patent application No. 61/898,009, filed Oct. 31, 2013.

The present application further relates to co-pending U.S. patent application Ser. No. 14/315,765, filed Jun. 26, 2014, entitled "SEMICONDUCTOR DEVICE WITH A POLYMER SUBSTRATE AND METHODS OF MANUFACTURING THE SAME." U.S. patent application Ser. No. 14/315,765 is a continuation of U.S. patent application Ser. No. 13/852,648, filed Mar. 28, 2013, which claims benefit of U.S. provisional patent application No. 61/773,490, filed Mar. 6, 2013. All of the applications listed above are hereby incorporated herein by reference in their entireties.

FIELD OF THE DISCLOSURE

This disclosure relates to semiconductor devices and methods for manufacturing the same.

BACKGROUND

Radio frequency complementary metal oxide semiconductor (RFCMOS) silicon-on-insulator (SOI) RF power switches are devices that are essential for practically every mobile handset currently on the market. Existing RFCMOS SOI technologies used to manufacture these devices provide excellent performance in increasingly complex multi-throw RF switches, tunable RF capacitance arrays, and antenna RF tuners. Conventional RFCMOS SOI technologies are built on high-resistivity CMOS wafer handles that have resistivities ranging from 1000 Ohm-cm to 5000 Ohm-cm. A power switch employing RFCMOS SOI technology uses a high-resistivity wafer handle so that a plurality of relatively low voltage field effect transistors (FETs) can be stacked while maintaining a desired isolation between the low-voltage FETs.

In an RF switch application for third generation (3G) and fourth generation (4G) wireless applications, a high degree of RF device linearity and a relatively very low level of RF intermodulation under RF power conditions are crucial. Therefore, inherent nonlinearities in RF devices such as CMOS n-type field effect transistor (NFET) devices must be mitigated. Another source of nonlinearities is attributed to a high-resistivity silicon handle wafer region interfaced with a buried oxide (BOX) dielectric region. One proposed solution for mitigating these nonlinearities includes a trap-rich silicon/oxide interface that degrades carrier lifetimes in the silicon/oxide interface. Other proposed solutions for mitigating the nonlinearities due to the high-resistivity handle region interfaced with the BOX dielectric region include harmonic suppression process techniques that include a series of process steps and heating treatments to minimize nonlinearities attributed to the high-resistivity handle region interfaced with the BOX dielectric region. However, all the aforementioned proposed solutions add significant complexity and cost to CMOS SOI technology. What is needed are CMOS SOI-based semiconductor devices and methods for manufacturing CMOS SOI devices that do not produce the nonlinearities attributed to the high-resistivity silicon handle region interfaced with the BOX dielectric region.

SUMMARY

A semiconductor device and methods for manufacturing the same are disclosed. The semiconductor device includes a polymer substrate and an interfacial layer over the polymer substrate. A buried oxide layer resides over the interfacial layer, and a device layer with at least a portion of a field effect device resides over the buried oxide layer. The polymer substrate is molded over a interfacial adhesion layer and has a thermal conductivity greater than 2 watts per meter Kelvin (W/mK) and an electrical resistivity greater than $10^{12}$ Ohm-cm. Methods of manufacture for the semiconductor device includes removing a wafer handle to expose a first surface of the buried oxide layer, disposing the interfacial adhesion layer onto the first surface of the buried oxide layer, and molding the polymer substrate onto the interfacial adhesion layer.

In an exemplary embodiment, a second interfacial adhesion layer is over the device layer, and a second polymer substrate is molded over the second interfacial adhesion layer. The second polymer substrate does not require identical characteristics to the polymer substrate molded to the interfacial adhesion layer disposed on the first surface of the buried oxide layer. However, the second polymer layer does have a thermal conductivity greater than 2 W/mK and an electrical resistivity greater than $10^{12}$ Ohm-cm. Further still, additional method steps to fabricate this exemplary embodiment include disposing the second interfacial adhesion layer over the device layer, and then molding the second polymer substrate directly onto the second interfacial adhesion layer. In at least one embodiment, an interlayer dielectric resides between the device layer and the second interfacial adhesion layer. Moreover, in at least one embodiment, the second interfacial adhesion layer is disposed directly onto the interlayer dielectric.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description, serve to explain the principles of the disclosure.

FIG. 8 is a specification table that lists thermal, mechanical, electrical, and physical specifications for an exemplary polymer material that is usable to form the polymer of the semiconductor device of the present disclosure.

DETAILED DESCRIPTION

Figure 1:
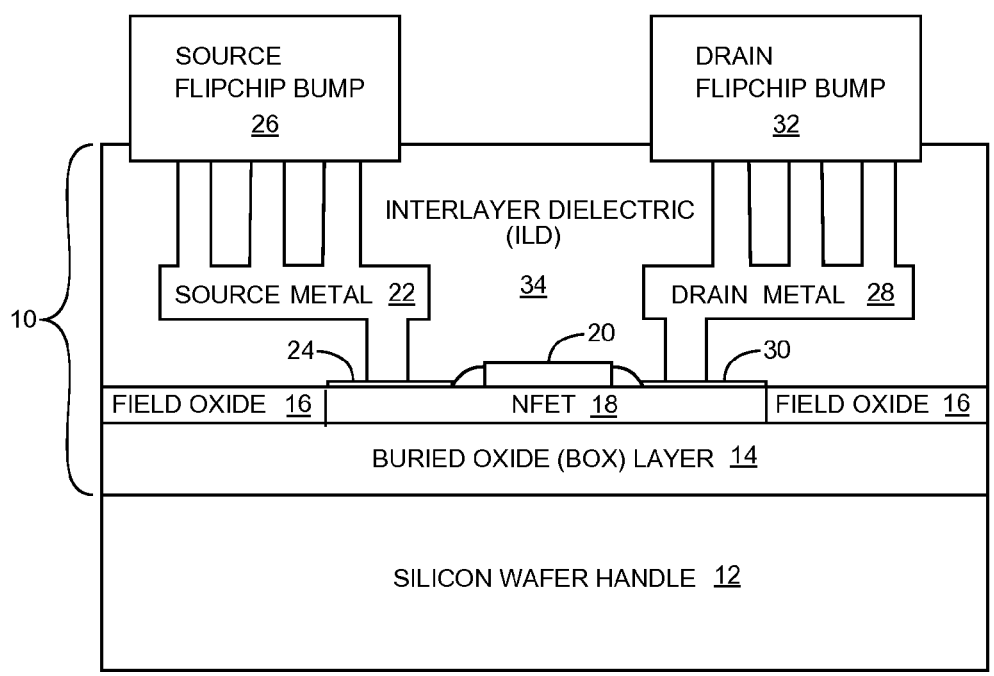
FIG. 1 is a cross-sectional diagram of a semiconductor stack structure interfaced with a relatively low-resistivity silicon wafer handle.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "disposed on," "in," or extending "onto" another element, it can be directly over, directly on, directly in, or extend directly onto the other element or intervening elements may also be present. In contrast, when an element is referred to as being "directly over," "directly on," "directly disposed on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures. Moreover, the phrase "electrically resistive" used herein means having a resistance greater than $10^6$ Ohm-cm. Also, the phrase "thermally conductive" used herein means having a thermal conductivity greater than 2 watts per meter Kelvin (W/mK).

Traditional radio frequency complementary metal oxide (RFCMOS) silicon-on-insulator (SOI) technologies have reached a fundamental barrier due to limitations inherent to silicon wafer handles that prevent the relatively better insulating characteristics available in group IV, group III-V, or sapphire wafer handles. The disclosed semiconductor device replaces the silicon wafer handle with a polymer. As such, the semiconductor device of this disclosure eliminates the need for a high-resistivity silicon wafer handle in a provided semiconductor stack structure.

Advanced silicon wafer handles for RF switch applications have resistivities that range from 1000 Ohm-cm to 5000 Ohm-cm and are significantly more costly than standard silicon wafer handles having much lower resistivities. Moreover, relatively complex process controls are needed to realize high resistivity in advanced silicon wafer handles. For these reasons, standard silicon wafer handles are used ubiquitously in standard SOI technologies. However, standard silicon wafer handles with their much lower resistivities are not conducive for stacking a plurality of relatively low-voltage field effect transistors (FETs) while maintaining a desired isolation between the low-voltage FETs. Fortunately, the polymer of the present disclosure replaces the silicon wafer handle and thus eliminates the problems associated with both high- and low-resistivity silicon wafer handles.

Additionally, the methods of the present disclosure allow for an immediate migration to 300 mm wafer handles for use in RF power switch applications. This is an important development since there is currently no commercially viable high-volume supply of high-resistivity radio frequency silicon-on-insulator (RFSOI) wafer handles in the 300 mm wafer diameter format. Fabricating the present semiconductor devices on 300 mm diameter wafers would provide a significant improvement in die costs. Moreover, the need for a trap-rich layer and/or harmonic suppression techniques is eliminated, thereby resulting in a significantly simpler process flow and lower cost.

Further still, the polymer is expected to eliminate RF nonlinear effects resulting from the interface between a buried oxide (BOX) layer and the silicon wafer handle used in traditional semiconductor processes to manufacture RF switch devices. The present methods realize RF switch devices that have linear characteristics relatively close to ideal linear characteristics.

In this regard, RF linearity in a switch device is characterized by harmonics levels and intermodulation distortion for both an on state and an off state. In order to measure harmonics levels, a single RF tone at a given power level and frequency is fed into an input of the switch and a spectrum analyzer is used to measure power levels at twice an input signal frequency, which is the second harmonic, and three times the signal frequency, which is the third harmonic. In particular, for output power levels of 25 dBm, harmonic levels less than about 110 dBm would be considered nearly ideal.

To measure intermodulation distortion, two closely spaced RF signals at a first frequency f1 and a second frequency f2 are fed into the switch input so that adjacent harmonic power at 2*f2−f1 can be measured. Next, an intercept point known as the third order intercept point (IP3) is extrapolated to where this distortion power equals the power of the two closely spaced RF signals. Switches that are nearly ideal would have IP3 levels that are greater than 90 dBm.

Additionally, the semiconductor device of this disclosure offers a near ideal voltage stacking of n-type field effect transistors (NFETs). Traditionally, the number of NFET devices that can be stacked is limited by silicon wafer handle resistivity combined with the interface effects between the BOX layer and the silicon wafer handle. This issue essentially limits the number of practical NFETs that can be stacked and thus limits the highest RF operating voltage for the resulting NFET stack. Replacing silicon wafer handles with the polymer of the present disclosure allows relatively many more NFETs to be practically ideally stacked. The resulting semiconductor device is operable at relatively much higher RF power levels and root mean square (RMS) voltages than is traditionally allowable on silicon handle wafer technologies. It is expected that a practically nearly ideal dielectric substrate such as the one provided by this disclosure is able to withstand RMS voltages greater than at least 200 V, whereas typical silicon substrates cannot withstand RMS voltages any greater than about 100 V.

In this regard, in the off state, the RF power switch must remain off during relatively high RMS voltage levels that will exist across the terminals of the switch. In RFSOI type switches, preventing the switch from coming out of the off state is accomplished by stacking a large number of off-state metal oxide semiconductor (MOS) transistors in series. In an ideal arrangement, an RF voltage across the switch terminals is equally distributed across an N number of MOS transistors making up the RF switch. For example, an N=10 stack of MOS transistors would ideally have 4 V across each MOS transistor for a total voltage of 40 V across the entire N=10 stack of MOS transistors. In this ideal case, the 4 V across each MOS transistor would be just below the breakdown voltage of each transistor. However, for a relatively large N stack of MOS transistors, there is a departure from an ideal V/N relationship. For example, to withstand 80 V RMS an ideal stack of N=20 transistors would be needed. However, in reality it has been discovered that N needs to be at least 30 transistors to withstand 80 V RMS. As a result, for the purpose of the disclosure practically nearly ideal stacking of transistors is defined as an upward deviation of no more than 10% from the ideal linear relationship of V/N.

Furthermore, the highest RF frequency of operation of RF power switches built with the disclosed polymer can be extended beyond the highest frequency of operation achievable with traditional RFCMOS SOI technologies. Typically, a silicon wafer handle resistivity is in the range of 1000-3000 Ohm-cm, which effectively imposes an operational high-frequency limit. The resulting resistivity of the polymer region in the semiconductor device taught in this disclosure is several orders of magnitude higher than what is achieved in high-resistivity silicon. For instance, there are polymers with nearly ideal electrical insulating characteristics, with resistivity values similar to what is obtained in gallium arsenide (GaAs) and sapphire semi-insulating wafer handles.

FIG. 1 is a cross-sectional diagram of a semiconductor stack structure 10 interfaced with a relatively low-resistivity silicon wafer handle 12. In the exemplary case of FIG. 1, the semiconductor stack structure 10 includes a buried oxide (BOX) layer 14, a field oxide layer 16, and a device layer containing at least a portion of an NFET 18, with a gate 20. A source metal conductor 22 couples a source contact 24 with a source flipchip bump 26. Similarly, a drain metal conductor 28 couples a drain contact 30 with a drain flipchip bump 32. An interlayer dielectric (ILD) 34 protects the gate 20 and supports the source flipchip bump 26 and the drain flipchip bump 32.

Figure 2:
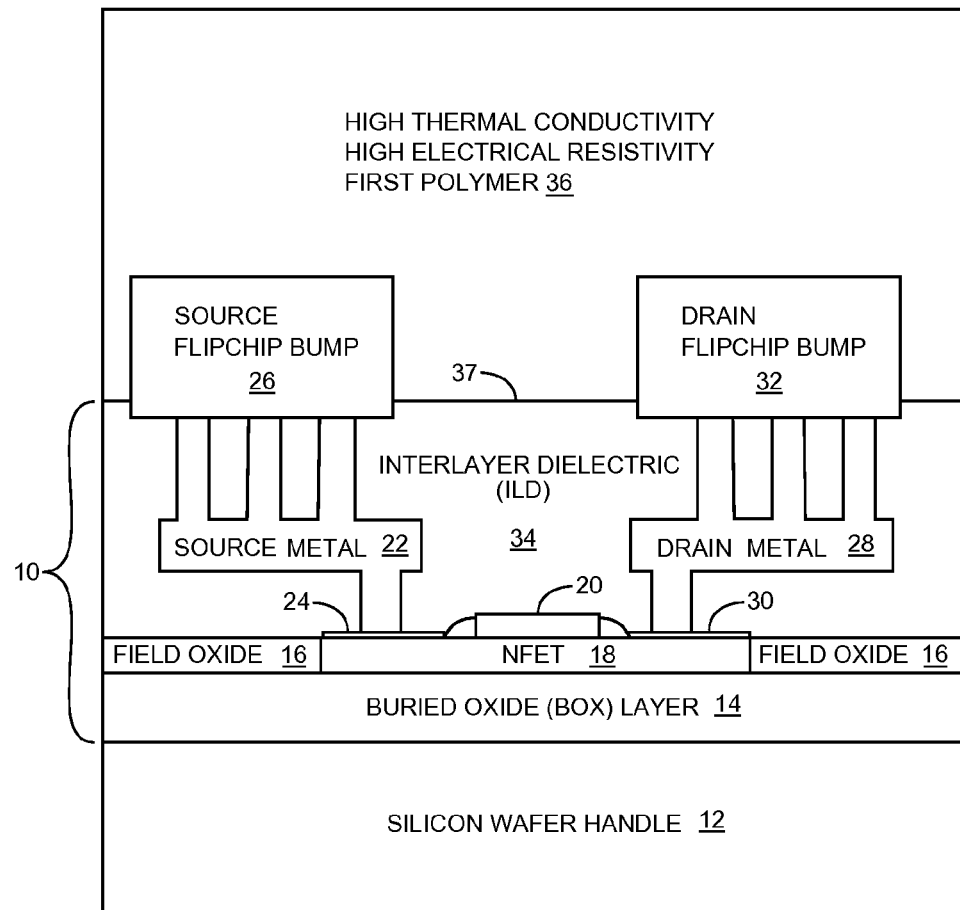
FIG. 2 is a cross-sectional diagram of the semiconductor stack structure with a first polymer disposed on a first surface of the semiconductor stack structure.

FIG. 2 is a cross-sectional diagram of the semiconductor stack structure 10 after a first polymer 36 having a relatively high thermal conductivity and relatively high electrical resistivity is disposed on a first surface 37 of the semiconductor stack 10 that includes the source flipchip bump 26 and the drain flipchip bump 32. The first polymer 36 has a thickness that at least encapsulates the source flipchip bump 26 and the drain flipchip bump 32 to protect them from damage during subsequent processing steps.

Figure 3:
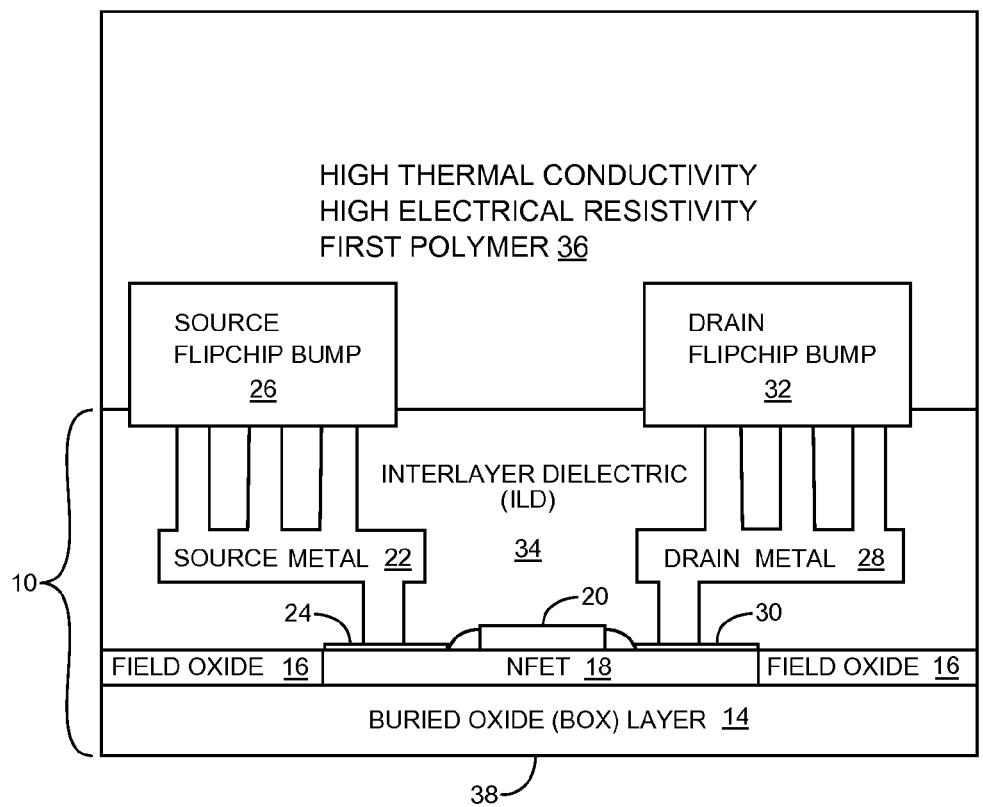
FIG. 3 is a cross-sectional diagram of the semiconductor stack structure after the relatively low-resistivity silicon wafer handle has been removed.

FIG. 3 is a cross-sectional diagram of the semiconductor stack structure 10 after the relatively low-resistivity silicon wafer handle 12 has been removed. Once the semiconductor stack structure 10 is protected by the first polymer 36, the silicon wafer handle 12 may be removed by a number of different techniques. One technique uses a conventional grind operation that removes a majority of the silicon wafer handle 12 followed by a selective wet or dry etch step of the remaining silicon wafer handle 12, and selectively stopping at a second surface 38 of the semiconductor stack structure 10. In this exemplary case, the second surface 38 is also the exposed surface of the BOX layer 14. However, it is to be understood that the exposed portion of the semiconductor stack structure 10 can be slightly deeper than the original second surface 38 depending on etch duration. Other techniques for removal of the silicon wafer handle 12 exist and are well documented in the literature. Some of these other techniques are based on dry or wet etch processes. The process used to remove the silicon wafer handle 12 is not particularly relevant to the present disclosure. However, it is desirable for the removal of the silicon wafer handle 12 to be accomplished without damaging the BOX layer 14 and the remainder of the semiconductor stack structure 10, as well as the source flipchip bump 26 and the drain flipchip bump 32.

Figure 4:
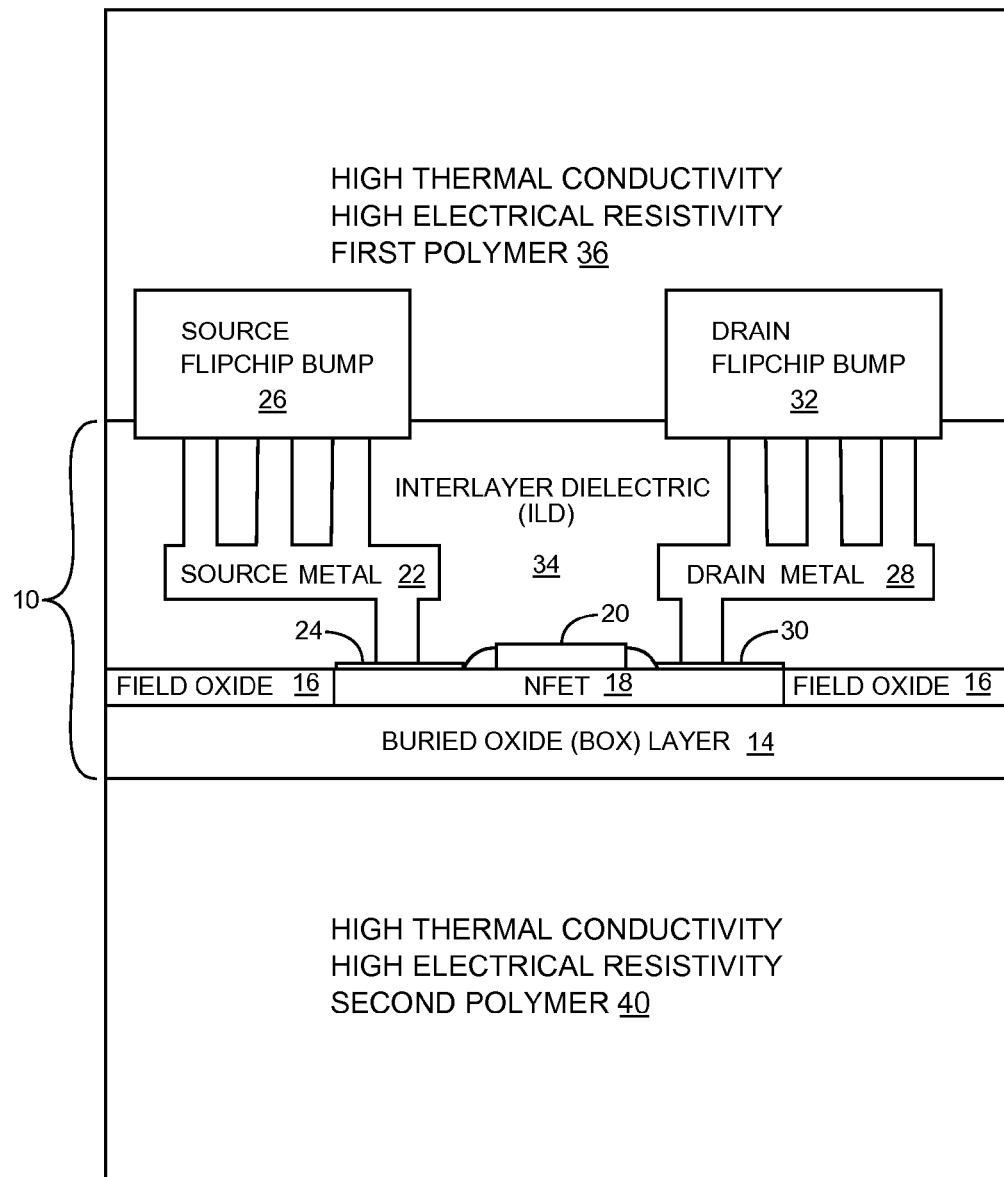
FIG. 4 is a cross-sectional diagram of the semiconductor stack structure after a second polymer has been disposed on a buried oxide (BOX) layer to realize the semiconductor device of the present disclosure.

FIG. 4 is a cross-sectional diagram of the semiconductor stack structure 10 after a second polymer 40 has been disposed on the BOX layer 14. The polymer material making up the first polymer 36 and the second polymer 40 has a unique set of characteristics in that the polymer material is both a relatively excellent electrical insulator and a relatively excellent heat conductor. Typical polymer materials making up common plastic parts are extremely poor conductors of heat. Poor heat conduction is a common characteristic of plastics normally used in an over-mold operation. However, there are engineered polymer materials that do provide relatively excellent heat conduction. Various formulations for such polymers yield thermal conductivities that range from greater than 2 W/mK to around 50 W/mK. In one embodiment, the thermal conductivity of the polymer ranges from around about 50 W/mK to around about 500 W/mK. Future enhancements in polymer science may provide additional improvements in terms of thermal conductivity while maintaining nearly ideal electrical insulating characteristics in the polymer. The structure of this disclosure benefits from the maximization of the polymer thermal conductivity, and it should be understood that an upper bound of polymer thermal conductivity nears a theoretical thermal conductivity of carbon nanotubes and graphene, which is 6600 W/mK.

It is desirable that a polymer material usable for the first polymer 36 and second polymer 40 be relatively strongly bondable to the second surface 38 of the semiconductor stack structure 10. For example, the polymer material needs a bonding strength that allows the semiconductor stack structure 10 to remain permanently bonded after additional processing steps, as well as throughout the operational lifetime of a semiconductor device comprising the semiconductor stack structure 10. Moreover, a desirable thickness for the first polymer 36 and the second polymer 40 ranges from around about 100 μm to around about 500 μm, but other desirable thicknesses for the first polymer 36 and the second polymer 40 can be thinner or thicker depending on the characteristics of the polymer material used to make up the first polymer 36 and the second polymer 40.

The polymer material making up the first polymer 36 and the second polymer 40 should also be a good electrical insulator. In general, the electrical resistivity of the first polymer 36 and the second polymer 40 should be greater than $10^6$ Ohm-cm. In at least one embodiment, the polymer has a relatively high electrical resistivity that ranges from around about $10^{12}$ Ohm-cm to around about $10^{16}$ Ohm-cm. In combination with relatively high electrical resistivity, the thermal conductivity of the first polymer 36 and the second polymer 40 is on the order of the thermal conductivity of typical semiconductors, which is typically greater than 2 W/mK. In one embodiment, the thermal conductivity of the first polymer 36 and the second polymer 40 ranges from greater than 2 W/mK to around about 10 W/mK. In yet another embodiment, the thermal conductivity of the first polymer 36 and the second polymer 40 ranges from around about 10 W/mK to around about 50 W/mK. As polymer science provides materials with additional thermal conductivities, these materials can be utilized in the semiconductor device of this disclosure. The semiconductor device of this disclosure benefits from the maximization of the polymer thermal conductivity, and it should be understood that an upper bound of polymer thermal conductivity nears a theoretical thermal conductivity of carbon nanotubes and graphene, which is 6600 W/mK.

Figure 5:
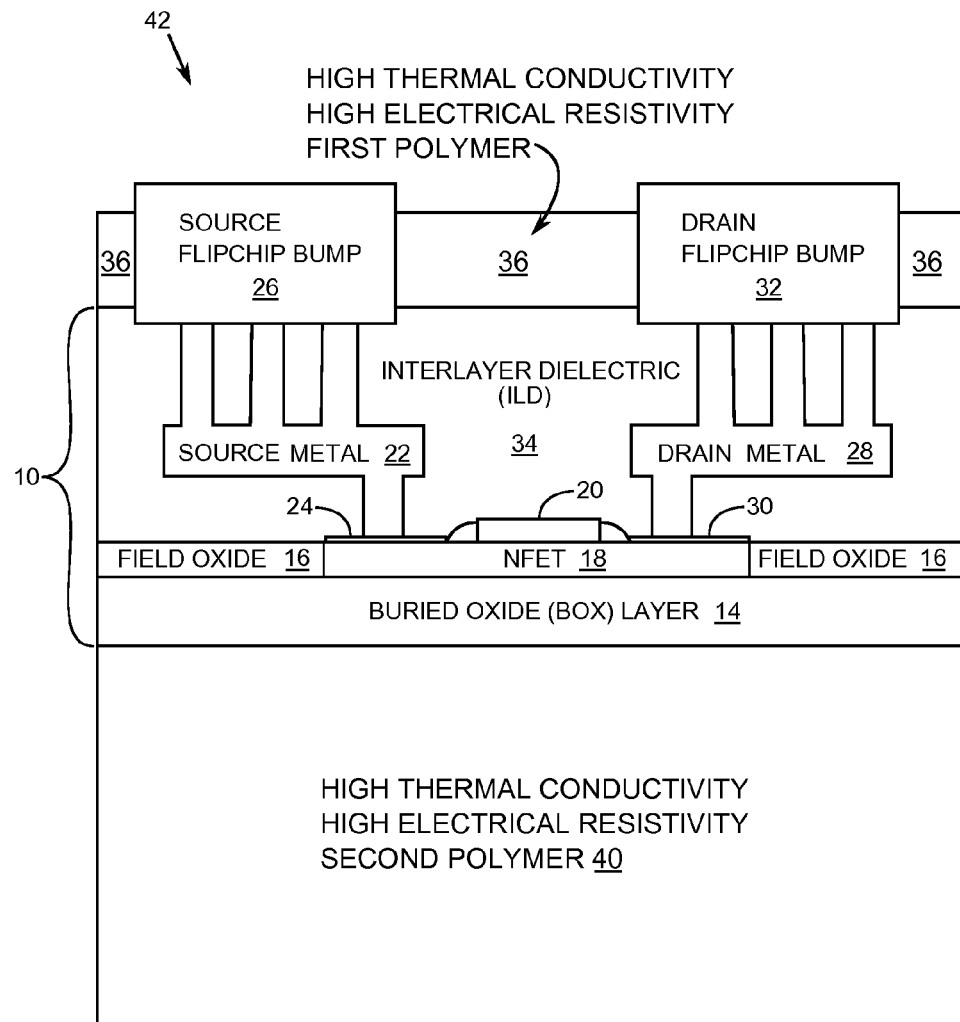
FIG. 5 is a cross-sectional diagram of the semiconductor stack structure after a portion of the first polymer has been removed to expose the electrical contacts to realize a completed semiconductor device.

FIG. 5 is a cross-sectional diagram of the semiconductor stack structure 10 after a portion of the first polymer 36 has been removed to expose the source flipchip bump 26 and the drain flipchip bump 32 to realize a completed semiconductor device 42. An exemplary process for removing a portion of the first polymer 36 includes a sample grind operation to etch back the first polymer 36 to expose at least electrically conductive contact patches of the source flipchip bump 26 and the drain flipchip bump 32. In one embodiment, the source flipchip bump 26 and the drain flip chip bump 32 should protrude from the remaining portion of the first polymer 36.

Figure 6:
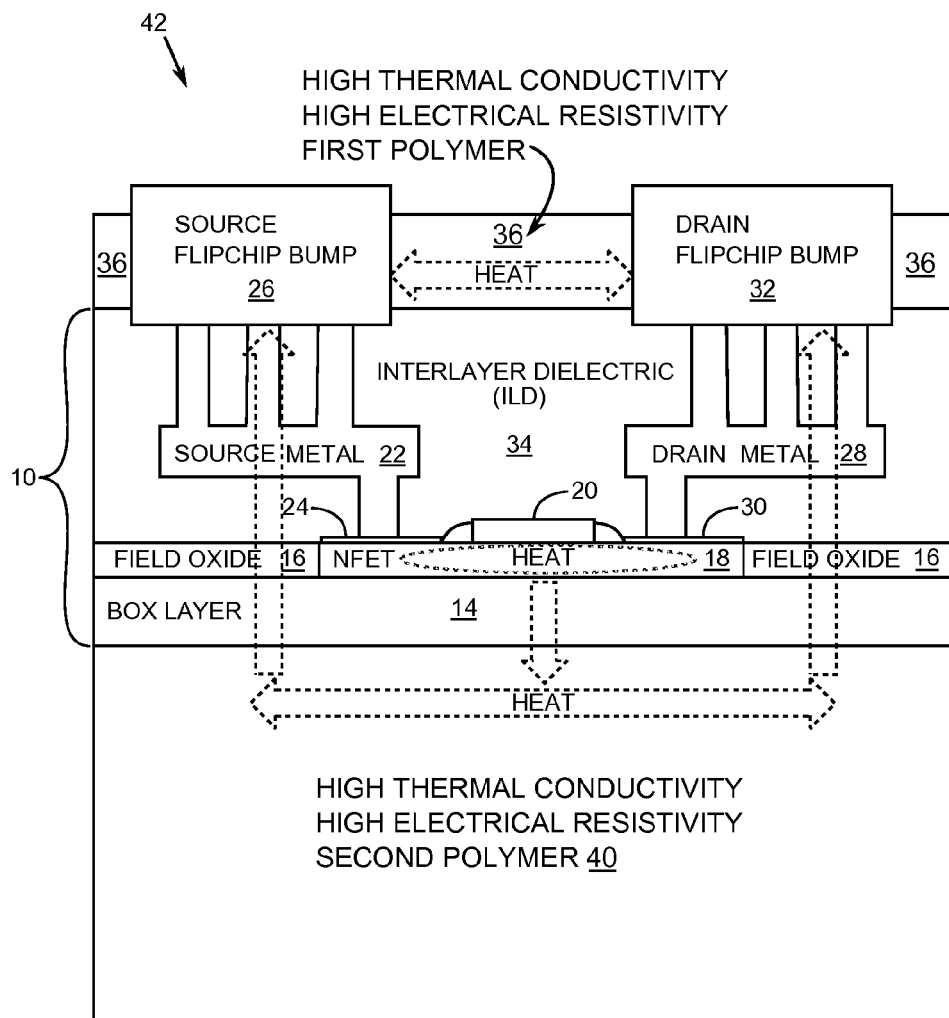
FIG. 6 is a cross-sectional diagram of the semiconductor device showing heat flow paths through the semiconductor device with the polymer after the semiconductor device has reached a steady state powered condition.

FIG. 6 is a cross-sectional diagram of the semiconductor device showing heat flow paths through the semiconductor device 42 with the second polymer 40 after the semiconductor device 42 has reached a steady state powered condition. Under normal operation, heat is generated by energy losses in the NFET 18. An origin for the heat generated is represented by a dashed oval in the NFET 18 adjacent to the BOX layer 14. The flow of heat is represented by dashed arrows. As usual for high-performance RF applications, the semiconductor device 42 is flipchip mounted in its final application. As such, the heat to be extracted is transferred by thermal conduction to the source flipchip bump 26 and the drain flipchip bump 32. Thermal analysis of typical SOI technologies indicates that unless the silicon wafer handle 12 (FIG. 1) is replaced with a good thermal conductive material, the NFET 18 quickly overheats under nominal conditions and essentially becomes very unreliable and likely fails. Under normal conditions and design rules, back-end-of-line metallization layers (not shown) provide too high a thermal resistance path to be used effectively as a means to dissipate the heat generated by the device. The second polymer 40 accomplishes effectively the same function as the original silicon wafer handle 12 from a thermal management point of view while also providing much improved linear characteristics and effectively much higher electrical resistivity than the 1 kOhm-cm electrical resistivity of the silicon wafer handle 12.

Figure 7:
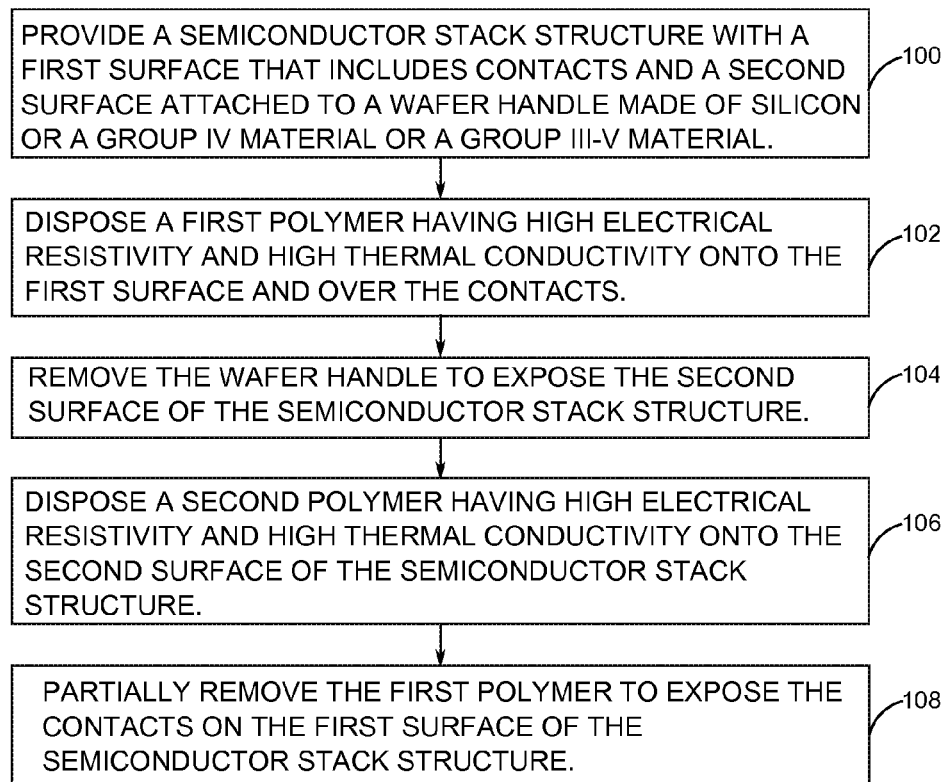
FIG. 7 is a process diagram that yields the semiconductor device of FIG. 6.

FIG. 7 is a process diagram that yields the semiconductor device 42 having the second polymer 40 disposed on the second surface 38, which in this exemplary case is an exposed portion of the semiconductor stack structure 10. However, it is to be understood that the exposed portion of semiconductor stack structure 10 can be slightly deeper than the original second surface 38 depending on etch duration. The exemplary process begins with providing the semiconductor stack structure 10 having the second surface 38 of the BOX layer 14 in direct contact with the silicon wafer handle 12 (step 100). While the semiconductor stack structure 10 is attached to the silicon wafer handle 12 at the beginning of the process, it is to be understood that a wafer handle made of other group IV or III-V semiconductors is also usable in place of the silicon wafer handle 12. The first polymer 36 having a high electrical resistivity and a high thermal conductivity is disposed to completely cover the contacts made up of the source flipchip bump 26 and the drain flipchip bump 32 (step 102). The process then continues by removing the silicon wafer handle 12 to expose the second surface 38 of the semiconductor stack structure 10 (step 104). The second polymer 40 can then be disposed on the second surface 38 using various polymer material disposing methods (step 106). Such methods for attaching the second polymer 40 to the semiconductor stack structure 10 include, but are not limited to, injection molding, spin deposition, spray deposition, and pattern dispensing of polymer material directly onto the second surface 38 of the semiconductor stack structure 10. Once the second polymer 40 is attached to the second surface 38 of the semiconductor stack structure 10, the first polymer 36 is partially removed to expose the contacts made up of the source flipchip bump 26 and the drain flipchip bump 32 (step 108).

The semiconductor device 42 can then be cleaned with common chemical solvents and/or plasma cleaning processes. The semiconductor device 42 can then be singulated from an original wafer (not shown) into individual die by a number of different conventional processes. Typically, a saw operation that cuts through the semiconductor stack structure 10 and first polymer 36 and the second polymer 40 is one method of die singulation. Other singulation methods such as laser sawing, laser scribing, or diamond scribing can be used as alternatives.

It should be noted that the semiconductor device and methods taught in this disclosure begin with a conventionally manufactured RFSOI CMOS wafer, which in this exemplary case is the semiconductor stack structure 10 disposed on the silicon wafer handle 12. However, one distinction is that there is no need for the silicon wafer handle 12 to have high resistivity, since the silicon wafer handle 12 is removed and does not become part of the semiconductor device 42. If the semiconductor device 42 requires flipchip packaging, it should ideally already include the source flipchip bump 26 and the drain flipchip bump 32, although such a requirement may not be necessary depending on the specific characteristics of the bump or pillar packaging technology employed. In this exemplary case, it is assumed that a wafer process was completed through bumping.

FIG. 8 is a specification table that lists thermal, mechanical, electrical, and physical specifications for an exemplary polymer material that is usable to form the first polymer 36 and the second polymer 40 of the semiconductor device 42. The exemplary polymer material specified in the specification table of FIG. 8 is made by Cool Polymers® and is sold under the label "CoolPoly® D5506 Thermally Conductive Liquid Crystalline Polymer (LCP)." It is to be understood that the specification table of FIG. 8 only provides exemplary specifications and that a variety of mechanical and physical properties are available within the scope of the present disclosure. Moreover, the quantitative values for the thermal and electrical properties provided in the table of FIG. 8 only represent exemplary values that are within the range of thermal and electrical properties already discussed in the above disclosure. The first polymer 36 and the second polymer 40 are a thermoplastic such as polyamides that include nylon. Other suitable thermoplastics include, but are not limited to, acrylonitrile butadiene styrene (ABS), polyetheretherketone (PEEK), and polysulfone. In some embodiments, the first polymer 36 and the second polymer 40 can be a thermoset plastic, such as a two-part epoxy resin. Moreover, the first polymer 36 and the second polymer 40 typically include an admixture for increasing thermal conductivity. Examples of suitable thermal conductivity enhancing admixtures include ceramic powders, which include, but are not limited to, boron nitride powder and aluminum nitride powder.

Figure 9:
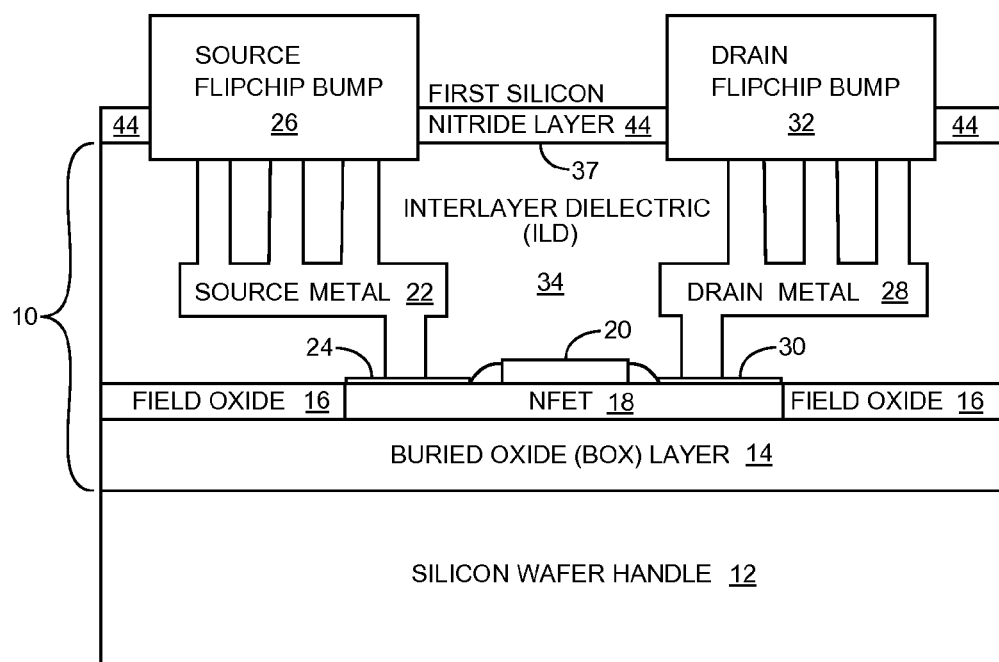
FIG. 9 is a cross-sectional diagram of the semiconductor stack structure after a first silicon nitride layer that is a first interfacial adhesion layer has been deposited on the first surface of the semiconductor stack structure.

FIG. 9 is a cross-sectional diagram of the semiconductor stack structure 10 after a first silicon nitride layer 44 that is a first interfacial adhesion layer has been deposited on the first surface 37 of the semiconductor stack structure 10 that includes the source flipchip bump 26 and the drain flipchip bump 32. The first silicon nitride layer 44 is an adhesion promoter for bonding a first polymer 36 to the semiconductor stack structure 10. However, it is to be understood, that other adhesion promoters are available and are within the scope of the present disclosure. For example, one adhesion promoter that would also be usable is aluminum nitride (AlN).

Figure 10:
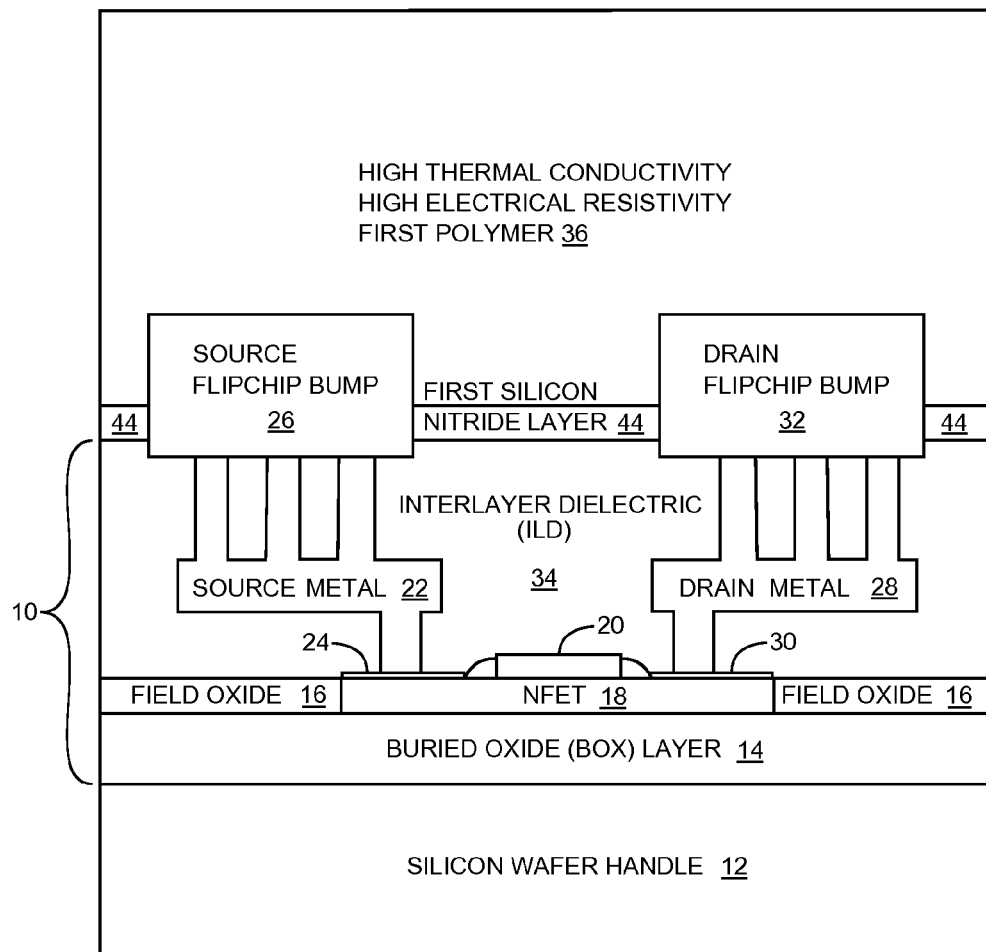
FIG. 10 is a cross-sectional diagram of the semiconductor stack structure after the first polymer has been deposited on the first silicon nitride layer.

FIG. 10 is a cross-sectional diagram of the semiconductor stack structure 10 after a first polymer 36 has been deposited on the first silicon nitride layer 44. The first polymer 36 has a high electrical resistivity and a high thermal conductivity and completely covers the electrical contacts made up of the source flipchip bump 26 and the drain flipchip bump 32. The electrical contacts are completely covered by the first polymer 36 to protect them during subsequent processing steps.

Figure 11:
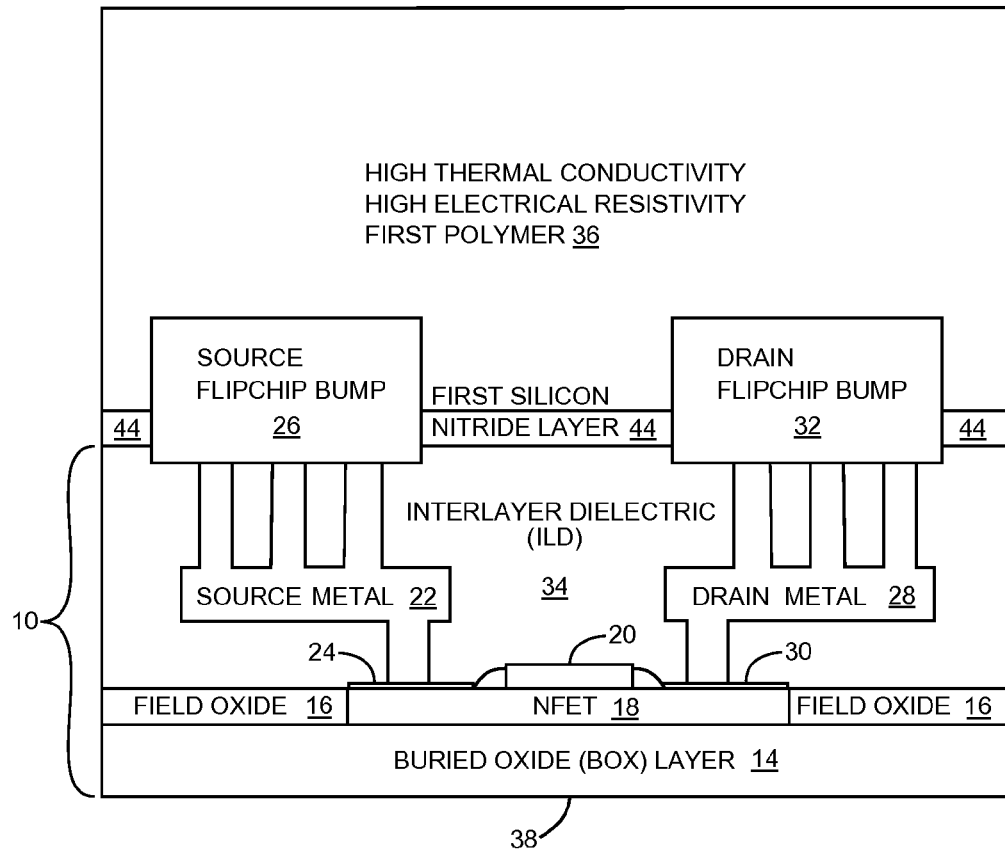
FIG. 11 is a cross-sectional diagram of the semiconductor stack structure after the silicon wafer handle has been removed.

FIG. 11 is a cross-sectional diagram of the semiconductor stack structure 10 after the relatively low-resistivity silicon wafer handle 12 has been removed. Once the semiconductor stack structure 10 is protected by the first polymer 36, the silicon wafer handle 12 may be removed by a number of different techniques. One technique uses a conventional grind operation that removes a majority of the silicon wafer handle 12 followed by a selective wet or dry etch step of the remaining silicon wafer handle 12, and selectively stopping at a second surface 38 of the semiconductor stack structure 10. In this exemplary case, the second surface 38 is also the exposed surface of the BOX layer 14. However, it is to be understood that the exposed portion of the semiconductor stack structure 10 can be slightly deeper than the original second surface 38 depending on etch duration, etc. Other techniques for removal of the silicon wafer handle 12 exist and are well documented in the literature. Some of these other techniques are based on dry or wet etch processes. The process used to remove the silicon wafer handle 12 is not particularly relevant to the present disclosure. However, it is desirable for the removal of the silicon wafer handle 12 to be accomplished without damaging the BOX layer 14 and the remainder of the semiconductor stack structure 10 as well as the source flipchip bump 26 and the drain flipchip bump 32.

Figure 12:
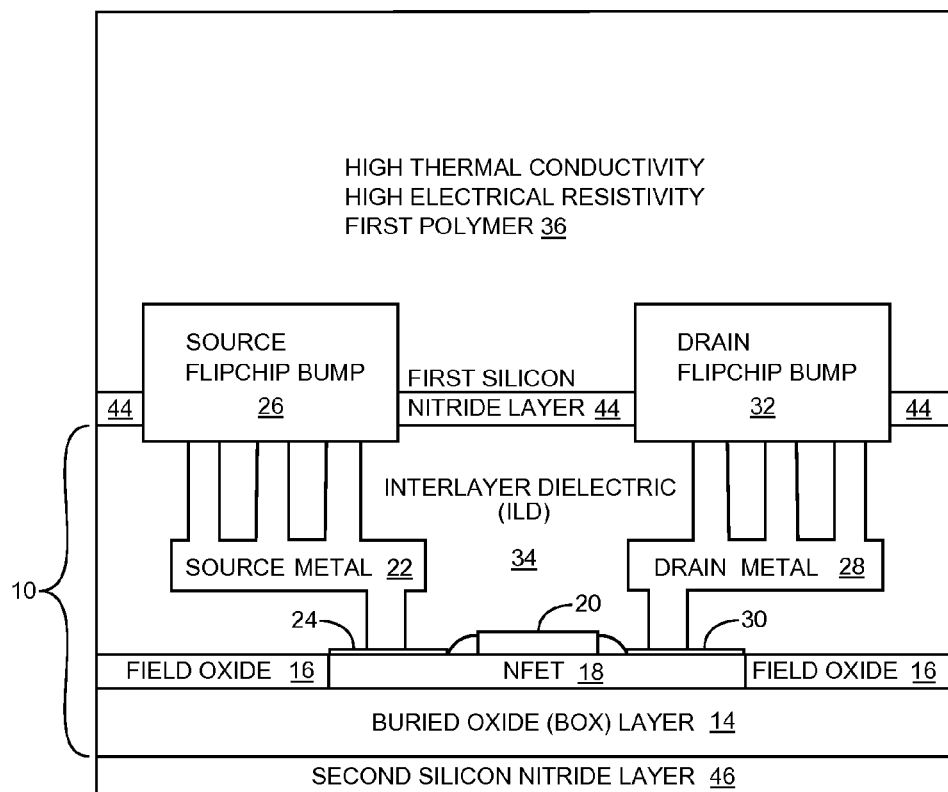
FIG. 12 is a cross-sectional diagram of the semiconductor stack structure after a second silicon nitride layer that is a second interfacial adhesion layer has been deposited on a second surface of the semiconductor stack structure.

FIG. 12 is a cross-sectional diagram of the semiconductor stack structure 10 after a second silicon nitride layer 46 that is a second interfacial adhesion layer has been deposited on the second surface 38 of the semiconductor stack structure 10. In this exemplary case, the second silicon nitride layer is disposed directly onto the BOX layer 14. The second polymer 40 can then be disposed on the second silicon nitride layer 46 using various polymer material disposing methods. In this exemplary case, the second polymer 40 is molded directly onto the second silicon nitride layer 46.

Figure 13:
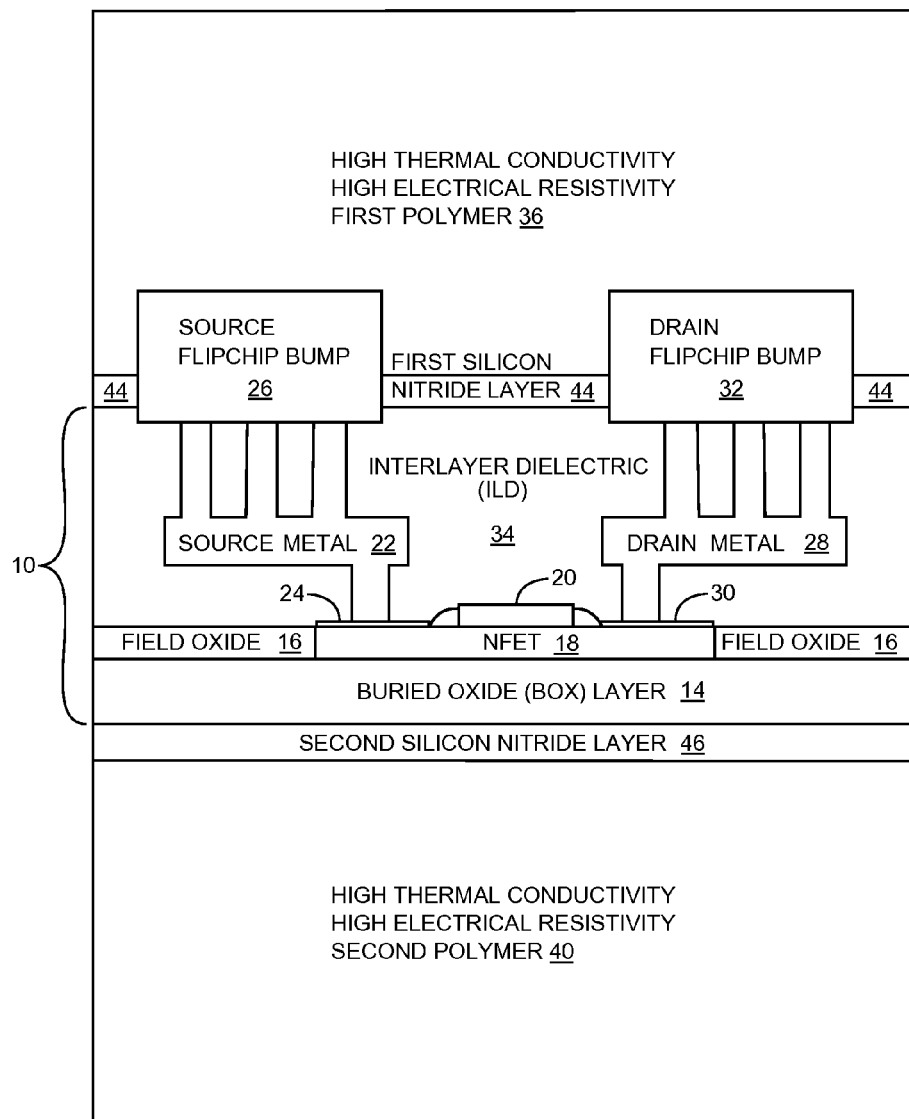
FIG. 13 is a cross-sectional diagram of the semiconductor stack structure after the second polymer has been deposited on the second silicon nitride layer.

FIG. 13 is a cross-sectional diagram of the semiconductor stack structure 10 after the second polymer 40 has been disposed on the second silicon nitride layer 46. In one respect, the first silicon nitride layer 44 and the second silicon nitride layer 46 are adhesion promoters for bonding the first polymer 36 and the second polymer 40 to the semiconductor stack structure 10. In another respect, the first silicon nitride layer 44 and the second silicon nitride layer 46 prevent or at least resist a diffusion of moisture within the first polymer 36 and the second polymer 40 from reaching the BOX layer 14 or other critical device layers that may include CMOS layers. The benefit of having a moisture barrier formed by the first silicon nitride layer 44 and the second silicon nitride layer 46 is the prevention of a degradation of function of devices that make up the semiconductor stack 10. The first silicon nitride layer 44 and the second silicon nitride layer 46 may be deposited as an example via a plasma-enhanced chemical vapor deposition (PECVD)

system by the decomposition of silane and nitrogen gases, as commonly known to those skilled in the art. Such PECVD systems operate at temperatures typically between room temperature and 350° C. The first silicon nitride layer 44 and the second silicon nitride layer 46 may also be deposited by other techniques, including liquid phase chemical vapor deposition (LPCVD) and sputtered from a nitride target using RF sputtering. The first silicon nitride layer 44 does not significantly impact the thermal conductivity provided by the first polymer 36. Likewise, the second silicon nitride layer 46 does not significantly impact the thermal conductivity provided by the second polymer 40. In one embodiment, the thickness of either of the first silicon nitride layer 44 and the second silicon nitride layer 46 ranges from around about 100 Å to around about 1000 Å. In another embodiment, the thickness of either of the first silicon nitride layer 44 and the second silicon nitride layer 46 ranges from around about 1000 Å to around about 5000 Å. In yet another embodiment, the thickness of either of the first silicon nitride layer 44 and the second silicon nitride layer 46 ranges from around about 5000 Å to around about 10,000 Å.

Figure 14:
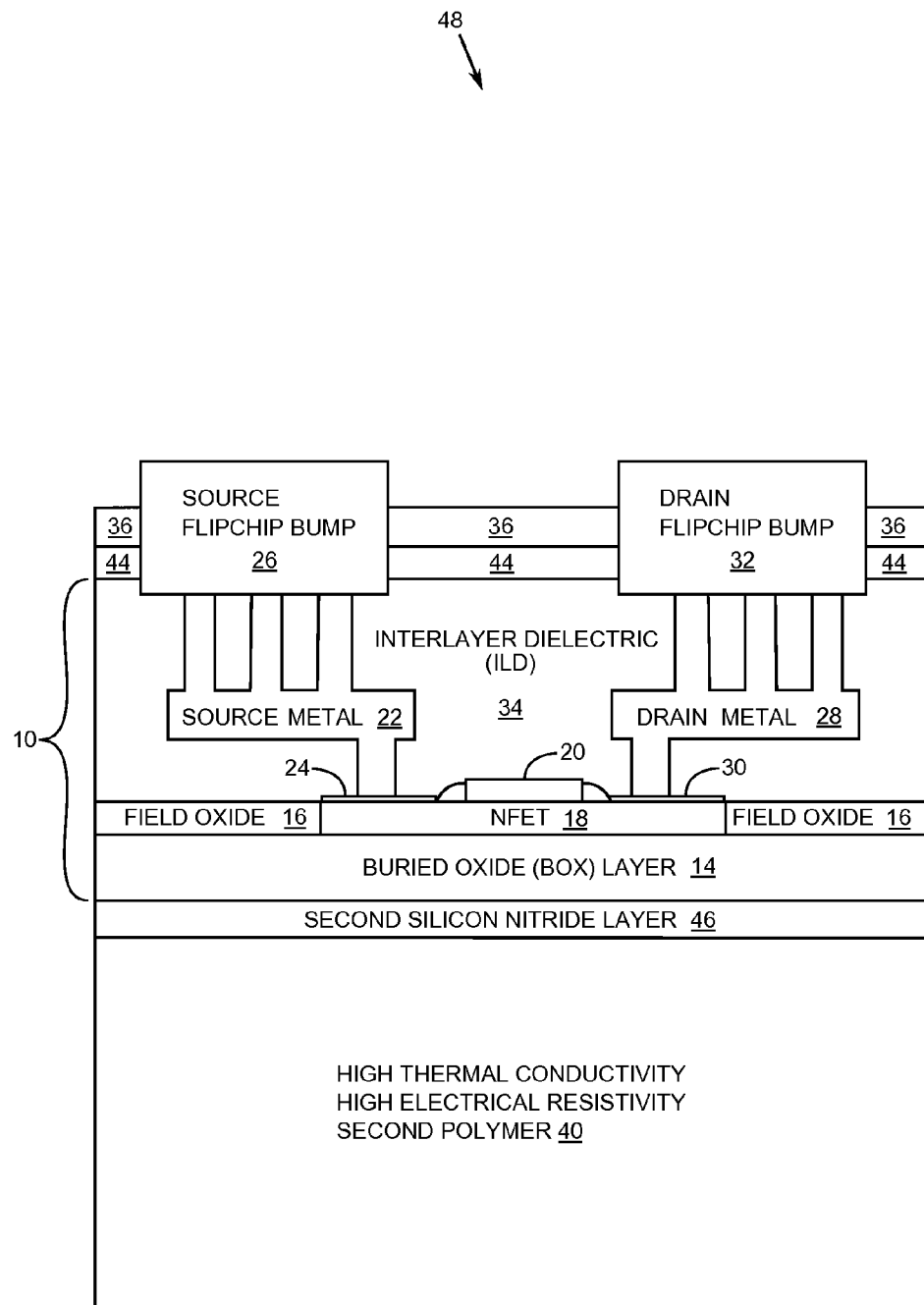
FIG. 14 is a cross-sectional diagram of the semiconductor stack structure after a portion of the first polymer has been removed to expose the electrical contacts.

FIG. 14 is a cross-sectional diagram of the semiconductor stack structure 10 after a portion of the first polymer 36 has been removed to expose the source flipchip bump 26 and the drain flipchip bump 32 to realize a completed semiconductor device 48. An exemplary process for removing a portion of the first polymer 36 includes a sample grind operation to etch back the first polymer 36 to expose at least electrically conductive contact patches of the source flipchip bump 26 and the drain flipchip bump 32. In one embodiment, the source flipchip bump 26 and the drain flip chip bump 32 should protrude from the remaining portion of the first polymer 36.

Figure 15:
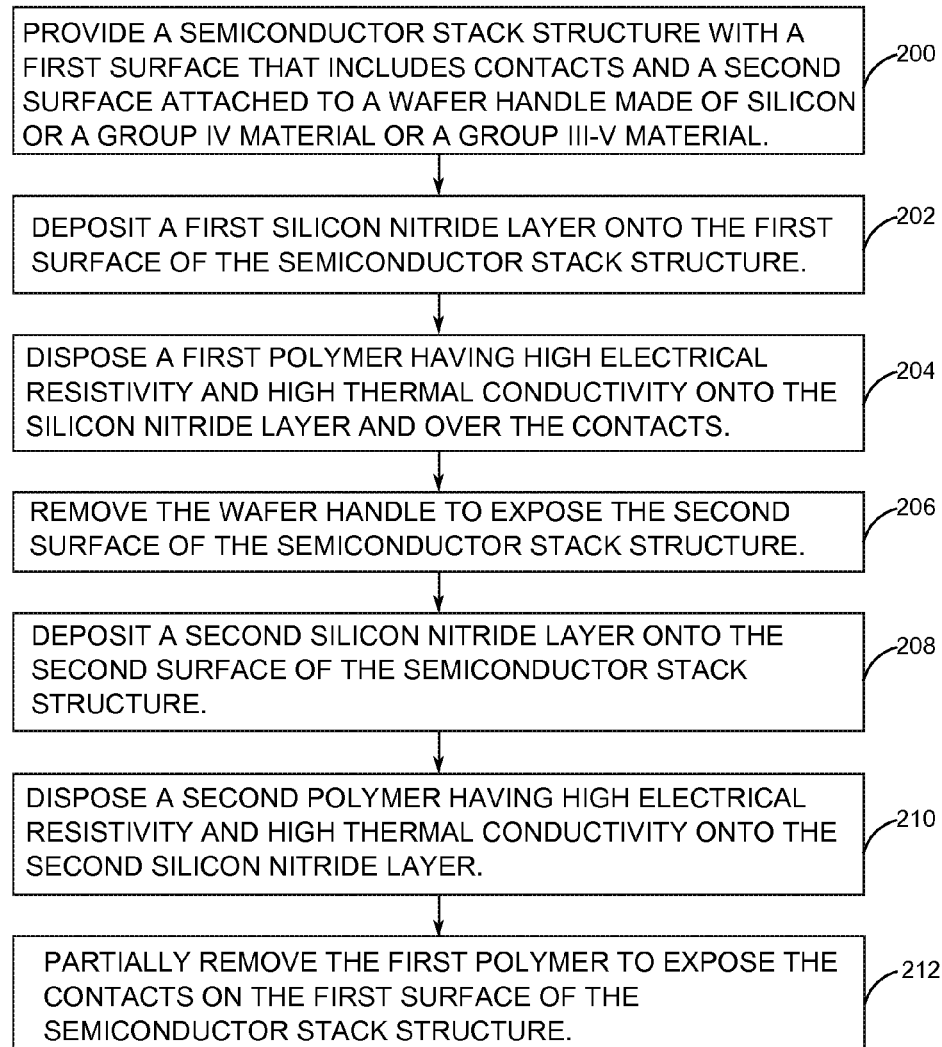
FIG. 15 is a process diagram that yields a semiconductor device of FIG. 14.

FIG. 15 is a process diagram that yields the semiconductor device having the first polymer 36 disposed on the first silicon nitride layer 44 and the second polymer 40 disposed on the second silicon nitride layer 46. An exemplary process begins with providing the semiconductor stack structure 10 having the first surface 37 including contacts such as source flipchip bump 26 and drain flipchip bump 32, along with the second surface 38 of the BOX layer 14, in direct contact with the silicon wafer handle 12 (step 200). While the semiconductor stack structure 10 is attached to the silicon wafer handle 12 at the beginning of the process, it is to be understood that a wafer handle made of other group IV or III-V semiconductors is also usable in place of the silicon wafer handle 12.

The first silicon nitride layer 44 is deposited on the first surface 37 of the semiconductor stack structure 10 that includes the contacts made up of the source flipchip bump 26 and the drain flipchip bump 32 (step 202). The first polymer 36 having a high electrical resistivity and a high thermal conductivity is disposed on the first silicon nitride layer 44 to completely cover the contacts made up of the source flipchip bump 26 and the drain flipchip bump 32 (step 204). The process then continues by removing the silicon wafer handle 12 to expose the second surface 38 of the semiconductor stack structure 10 (step 206). Next, a second silicon nitride layer 46 is deposited on the second surface 38 of the semiconductor stack structure 10 (step 208). The second polymer 40 can then be disposed on the second silicon nitride layer 46 using various polymer material disposing methods (step 210). Such methods for attaching the polymer 42 to the second silicon nitride layer 46 of the semiconductor stack structure 10 include, but are not limited to, injection molding, spin deposition, spray deposition, and pattern dispensing of polymer material directly onto the second silicon nitride layer 46. Once the second polymer 40 is attached to the silicon nitride layer 46, the first polymer 36 is partially removed to expose the contacts made up of the source flipchip bump 26 and the drain flipchip bump 32 (step 212).

Those skilled in the art will recognize improvements and modifications to the embodiments of the present disclosure. All such improvements and modifications are considered within the scope of the concepts disclosed herein and the claims that follow.

What is claimed is:

1. A method of manufacture for a semiconductor device comprising:
   providing a device layer comprising at least a portion of a field effect device;
   providing a buried oxide layer that has a first surface in direct contact with a wafer handle and a second surface under the device layer;
   removing the wafer handle to expose the buried oxide layer;
   disposing an interfacial adhesion layer onto the first surface of the buried oxide layer; and
   molding a polymer substrate having a thermal conductivity that is greater than 2 watts per meter Kelvin (W/mK) and an electrical resistivity greater than $10^3$ Ohm-cm directly onto the interfacial adhesion layer.

2. The method of manufacture for a semiconductor device of claim 1 wherein the disposing of the interfacial adhesion layer is accomplished using chemical vapor deposition operated at temperature that is no greater than about 200°C.

3. The method of manufacture for a semiconductor device of claim 2 wherein the chemical vapor deposition is plasma-enhanced chemical vapor deposition (PECVD).

4. The method of manufacture for a semiconductor device of claim 1 wherein the disposing of the interfacial adhesion layer is accomplished using chemical vapor deposition operated at temperature that is between about 200°C. and 350°C.

5. The method of manufacture for a semiconductor device of claim 4 wherein the chemical vapor deposition is liquid phase chemical vapor deposition.

6. The method of manufacture for a semiconductor device of claim 1 wherein the disposing of the interfacial adhesion layer is accomplished using radio frequency sputtering.

7. The method of manufacture for a semiconductor device of claim 1 wherein the interfacial adhesion layer is a silicon nitride layer.

8. The method of manufacture for a semiconductor device of claim 1 wherein the interfacial adhesion layer is between about 100 Angstroms and about 250 Angstroms.

9. The method of manufacture for a semiconductor device of claim 1 wherein the interfacial adhesion layer is between about 250 Angstroms and about 500 Angstroms.

10. The method of manufacture for a semiconductor device of claim 1 wherein the interfacial adhesion layer is between about 500 Angstroms and 1000 Angstroms.

11. The method of manufacture for a semiconductor device of claim 1 wherein the thermal conductivity of the polymer substrate ranges from greater than 2 watts per meter Kelvin (W/mK) to around about 10 W/mK.

12. The method of manufacture for a semiconductor device of claim 1 wherein the thermal conductivity of the polymer substrate ranges from around about 10 W/mK to around about 50 W/mK.

13. The method of manufacture for a semiconductor device of claim 1 wherein the thermal conductivity of the polymer substrate ranges from around about 50 W/mK to around about 6600 W/mK.

14. The method of manufacture for a semiconductor device of claim 1 wherein a thermal resistivity of the polymer substrate is around about 0.1 mK/W.

15. The method of manufacture for a semiconductor device of claim 1 wherein the electrical resistivity of the polymer substrate ranges from around about $10^{12}$ Ohm-cm to around about $10^{16}$ Ohm-cm.

16. The method of manufacture for a semiconductor device of claim 1 wherein the electrical resistivity of the polymer substrate is between greater than $10^3$ Ohm-cm and $10^{12}$ Ohm-cm.

17. The method of manufacture for a semiconductor device of claim 1 wherein the polymer substrate has a thickness that ranges from around about 10 μm to around about 100 μm.

18. The method of manufacture for a semiconductor device of claim 1 wherein the polymer substrate has a thickness that ranges from around about 100 μm to around about 500 μm.

19. The method of manufacture for a semiconductor device of claim 1 wherein the polymer substrate has a thickness that ranges from around about 500 μm to around about 1000 μm.

20. The method of manufacture for a semiconductor device of claim 1 further comprising:
   disposing a second interfacial adhesion layer over the device layer; and
   molding a second polymer substrate having a thermal conductivity that is greater than 2 W/mK and an electrical resistivity greater than $10^{12}$ Ohm-cm directly onto the second interfacial adhesion layer.

* * * * *